(12) United States Patent
Maley

(10) Patent No.: US 9,054,410 B2
(45) Date of Patent: Jun. 9, 2015

(54) DIPOLE STRENGTH CLIP

(75) Inventor: Gregory Joseph Maley, Downers Grove, IL (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 484 days.

(21) Appl. No.: 13/479,599

(22) Filed: May 24, 2012

(65) Prior Publication Data

US 2013/0314292 A1  Nov. 28, 2013

(51) Int. Cl.
| | |
|---|---|
| *H01Q 9/16* | (2006.01) |
| *H01Q 21/26* | (2006.01) |
| *H01Q 1/12* | (2006.01) |
| *H05K 1/14* | (2006.01) |
| *H05K 3/36* | (2006.01) |

(52) U.S. Cl.
CPC ............ *H01Q 9/16* (2013.01); *H01Q 21/26* (2013.01); *H01Q 1/1207* (2013.01); *H05K 1/141* (2013.01); *H05K 3/366* (2013.01); *H05K 2201/048* (2013.01); *H05K 2201/09027* (2013.01); *H05K 2201/09145* (2013.01); *H05K 2201/10598* (2013.01)

(58) Field of Classification Search
CPC ............... H05K 2201/048; H05K 2201/10598
USPC .................................................... 343/797, 810
See application file for complete search history.

(56) References Cited

U.S. PATENT DOCUMENTS

| | | | | |
|---|---|---|---|---|
| 5,268,701 | A * | 12/1993 | Smith | 343/767 |
| 6,067,053 | A * | 5/2000 | Runyon et al. | 343/797 |
| 2006/0244667 | A1 * | 11/2006 | Thompson et al. | 343/713 |

\* cited by examiner

*Primary Examiner* — Sue A Purvis
*Assistant Examiner* — Michael Bouizza
(74) *Attorney, Agent, or Firm* — Husch Blackwell LLP

(57) ABSTRACT

An antenna comprising PCB elements mechanically secured by a clip is provided. The antenna has a feedboard printed circuit board having a feed network, at least one radiating element, and the clip. The radiating element includes first and second printed circuit boards, each having a base disposed on a surface of the feedboard printed circuit board. In one example, the printed circuit boards each further include a dipole disposed above the feedboard. In another example, the PCBs are supports and a cross-polarized radiating may be mounted on top. The first and second PCBs may include slots so that the boards may be assembled together. The PCBs also include an extension extending through a first slot on the feedboard PCB, and indentations disposed on the first extension. The clip may have retainers that engage the indentations of the extensions.

8 Claims, 7 Drawing Sheets

DIPOLE STRENGTH CLIP

BACKGROUND

Antennas for wireless voice and/or data communications typically include an array of radiating elements connected by one or more feed networks. For efficient transmission and reception of Radio Frequency (RF) signals, the dimensions of radiating elements are typically matched to the wavelength of the intended band of operation. Because the wavelength of the GSM 900 band (e.g., 880-960 MHz) is longer than the wavelength of the GSM 1800 band (e.g., 1710-1880 MHz), the radiating elements for one band are typically not used for the other band. Radiating elements may also be dimensioned for operation over wider bands, e.g., a low band of 698-960 MHz and a high band of 1710-2700 MHz. In this regard, dual band antennas have been developed which include different radiating elements for each of the two bands. See, for example, U.S. Pat. No. 6,295,028, U.S. Pat. No. 6,333,720, U.S. Pat. No. 7,238,101 and U.S. Pat. No. 7,405,710, the disclosures of which are incorporated by reference.

Additionally, base station antennas (BSA) with +/−45 degree slant polarizations are widely used for wireless communications. Two polarizations are used to overcome of multipath fading by polarization diversity reception. The vast majority of BSA have +/−45 degree slant polarizations. Examples of prior art can be crossed dipole antenna element U.S. Pat. No. 7,053,852, or dipole square ("box dipole"), U.S. Pat. No. 6,339,407 or U.S. Pat. No. 6,313,809, having 4 to 8 dipole arms. Each of these patents are incorporated by reference. The +/−45 degree slant polarization is often desirable on multiband antennas.

There are numerous ways to fabricate cross polarized radiating elements. See, for example, U.S. Pat. No. 7,688,271, the disclosure of which is incorporated by reference. In this example, the printed circuit boards ("crossed legs") have a dipole radiating element attached at the top, and are soldered into a feed network at the bottom. This is accomplished by including a pair of tabs on the legs, which pass through corresponding slots on a base PCB.

While low cost, a disadvantage of such an assembly is that the solder joints provide both an electrical connection and a mechanical connection. Mechanical stresses on the legs may cause a premature failure of the solder joints and loss of signal connectivity.

SUMMARY

An antenna comprising PCB elements mechanically secured by a clip is provided. The antenna has a feedboard printed circuit board having a feed network, at least one radiating element, and the clip. The radiating element includes first and second printed circuit boards, each having a base disposed on a surface of the feedboard printed circuit board. In one example, the printed circuit boards each further include a dipole disposed above the feedboard. In another example, the PCBs are supports and a cross-polarized radiating may be mounted on top.

The first and second PCBs may include slots so that the boards may be assembled together. The PCBs also include an extension extending through a first slot on the feedboard PCB, and indentations disposed on the first extension. The clip may have retainers that engage the indentations of the extensions.

In another example, the antenna may comprise a plurality of radiating elements and a plurality of clips arranged in an array.

In another example, the retainers of the clip further include a slot that is dimensioned to receive a printed circuit board of the thickness of the dipole printed circuit boards and a nub that is dimensioned to engage one of the indentations of the first and second dipole printed circuit boards. The retainer may further include one or more gussets to improve the retaining force of the clip.

DETAILED DESCRIPTION

Figure 1:
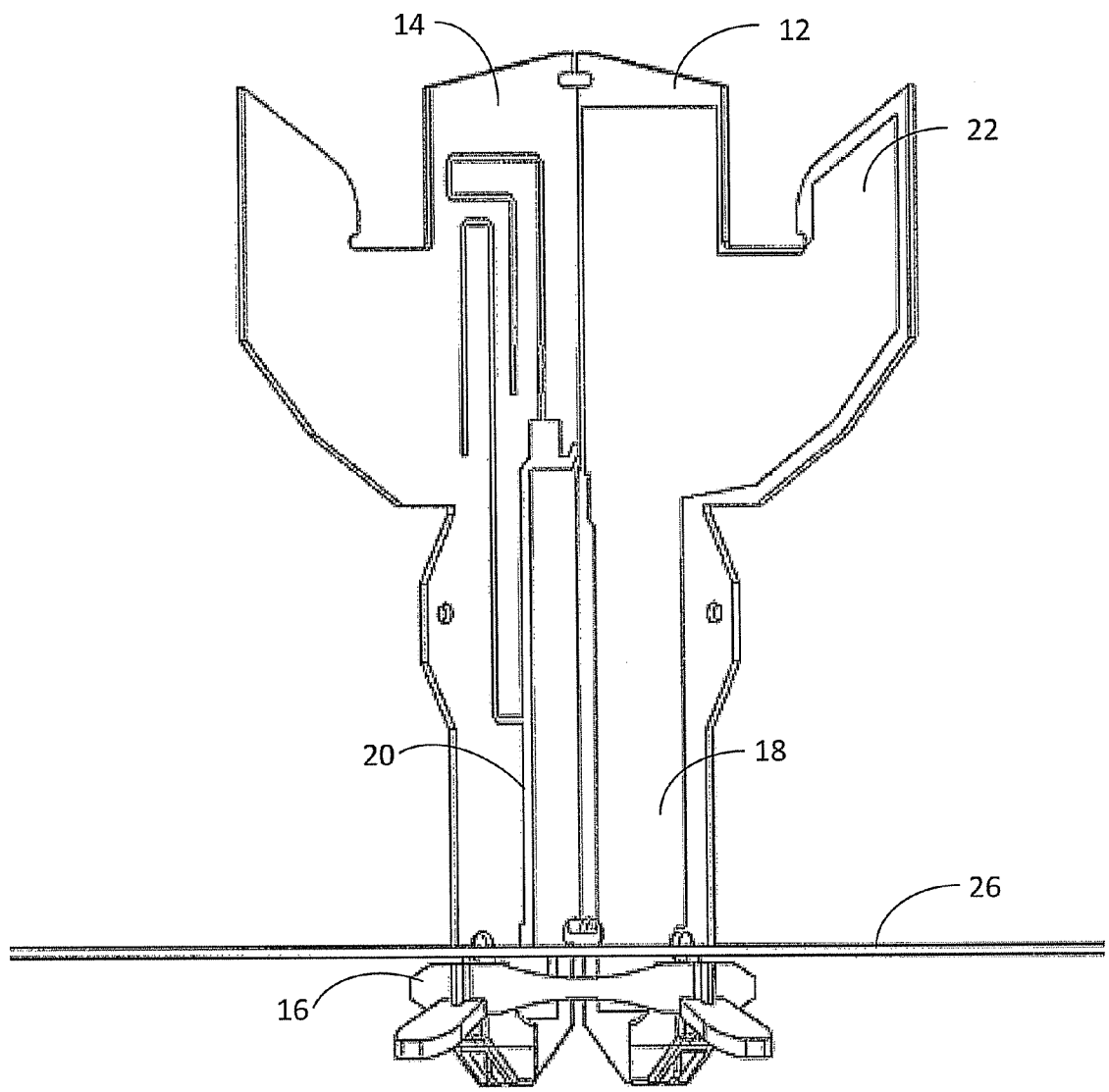
FIG. 1 is a side view of an antenna element according to one example of the present invention.

FIG. 1 illustrates a dipole radiating element 10 accordingly to one example of the present invention. The cross dipole radiating element 10 comprises a first dipole PCB 12, a second dipole PCB 14, and a clip 16. Each dipole PCB 12, 14 is a printed circuit board having a conductive plane 18, a feed line 20, and a dipole 22. The dipole 22 is capacitively coupled to the feed line 20. In the illustrated example, the dipole 22 is part of the conductive plane 18. A portion of the conductive plane 18 opposite from the dipole 22 may be connected to a ground plane on a feedboard PCB 26. The dipole PCBs 12, 14 are fitted together such that the dipoles 22 are at approximately right angles to each other.

In this example, each of the first and second dipole PCBs 12, 14 comprises a base and a polarized radiating element. When combined, the first and second dipole PCBs 12, 14 comprise a cross-polarized radiating element. The base of the radiating elements may be considered to include all of the structure. In other examples, the base includes all of the structure other than the radiators (e.g., radiators are separately fabricated and attached to the base or bases).

Referring to FIGS. 1 and 10-12, the dipole PCBs also include shoulders 24, which support the dipole PCBs 12, 14 on the feedboard PCB 26. The dipole PCB further includes extensions 27, which extend below the shoulders 24 and through the feedboard PCB 26. The feed line 20 on each dipole PCB 12, 14 continues to an extension 27. The feed line may then be connected to a feed network on a surface of the feedboard PCB opposite the radiating element. The extensions 27 of each dipole PCB also include an indentation 28.

The clip 16 is preferably non-conductive. Accordingly, the clip 16 provides mechanical retaining force, and does not provide an electrical connection. After the dipole PCBs are retained by a clip 16, electrical connections between the feed lines and the feed network may be made by soldering. Because the clip 16 provides a stable mechanical connection, stresses to the solder connections are reduced or eliminated, and the electrical connection is made more reliable than previously known.

Figure 2:
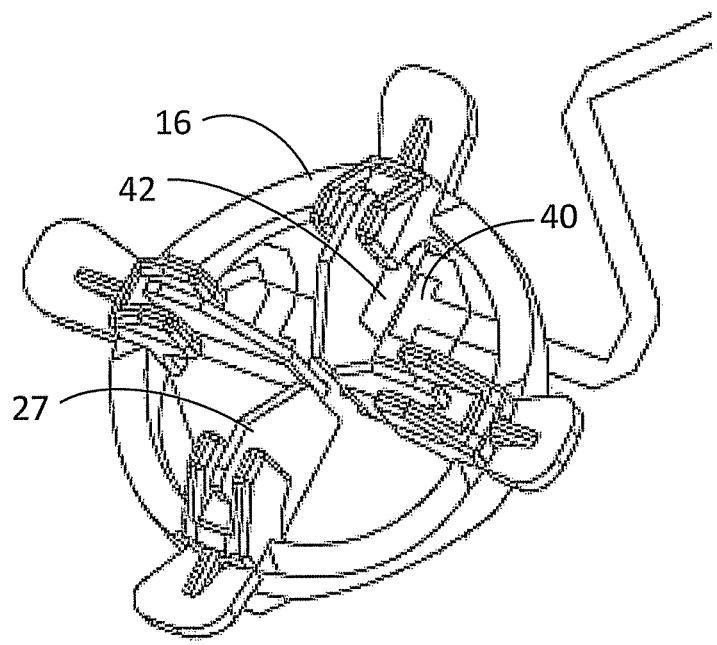
FIG. 2 is a simplified perspective view of selected aspects of an antenna element according to one example of the present invention.
Figure 3:
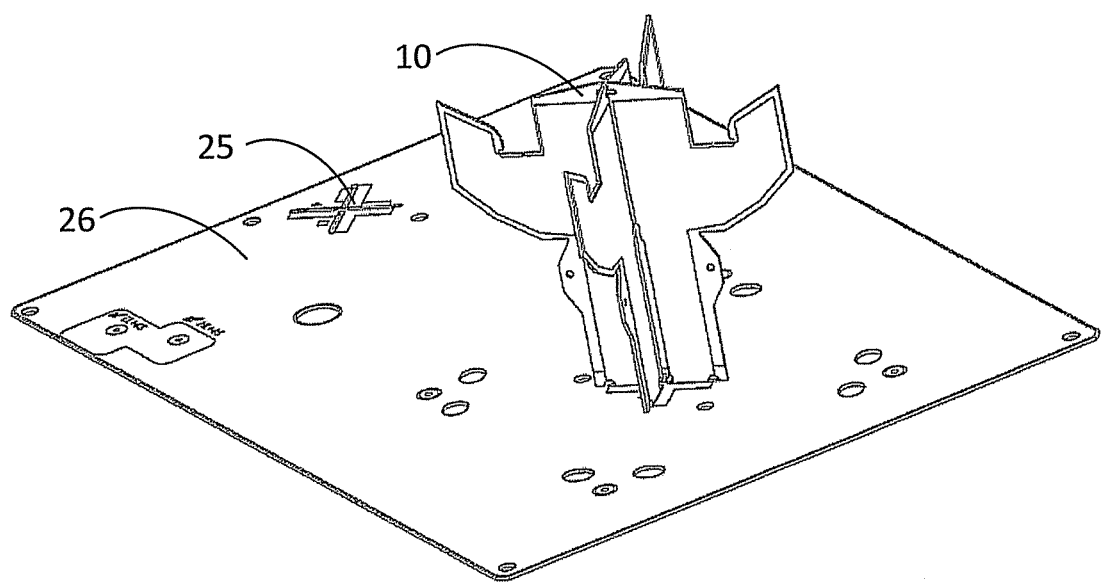
FIG. 3 is a simplified perspective view of selected aspects of an antenna element according to one example of the present invention.

FIG. 2 illustrates a clip 16 installed to retain a pair of dipole PCBs 12, 14 when viewed from the underside of the feedboard PCB 26. Electrical connections are made between a pad 40 on the feedboard PCB and a pad 42 on the dipole PCB. For purposes of clarity other details of the feed network are not shown. This figure illustrates the arrangement of the components before soldering. Referring to FIG. 3, the top side of feedboard 26 is illustrated, with one radiating element 10 installed. A set of apertures 25 is also provided for accepting a second radiating element 10. As illustrated in this example, the cross polarized radiating elements 10 are oriented so that they are at +/-45 degrees with respect to the longitudinal and transverse axes of the feedboard 26.

Referring to FIGS. 4-9, the clip 16 may be thermo-set plastic or other suitable material. The clip 16 may be approximately circular when viewed from the top. The clip 16 includes four slots 30. The slots 30 are dimensioned to accept the extensions 27 of the dipole PCBs. The slots 30 preferably include a nub 32. The nub 32 is dimensioned to engage the indentation 28 of the extensions 27. The clip may also include gussets 34 to improve mechanical strength so that the slot 30 and nub 32 combinations provide adequate retaining strength for the dipole PCBs 12, 14. Tabs 38 may be included to assist in removal of clip 16. Pressing on tabs 38 reduces the retaining force of nubs 32. There are four slots 30 and nubs 32 on a clip 16, spaced approximately 90 degrees from each other. A given slot and nub cooperates with an opposing slot and nub (i.e., 180 degrees opposite) to capture and mechanically retain a given dipole PCB.

Figure 4:
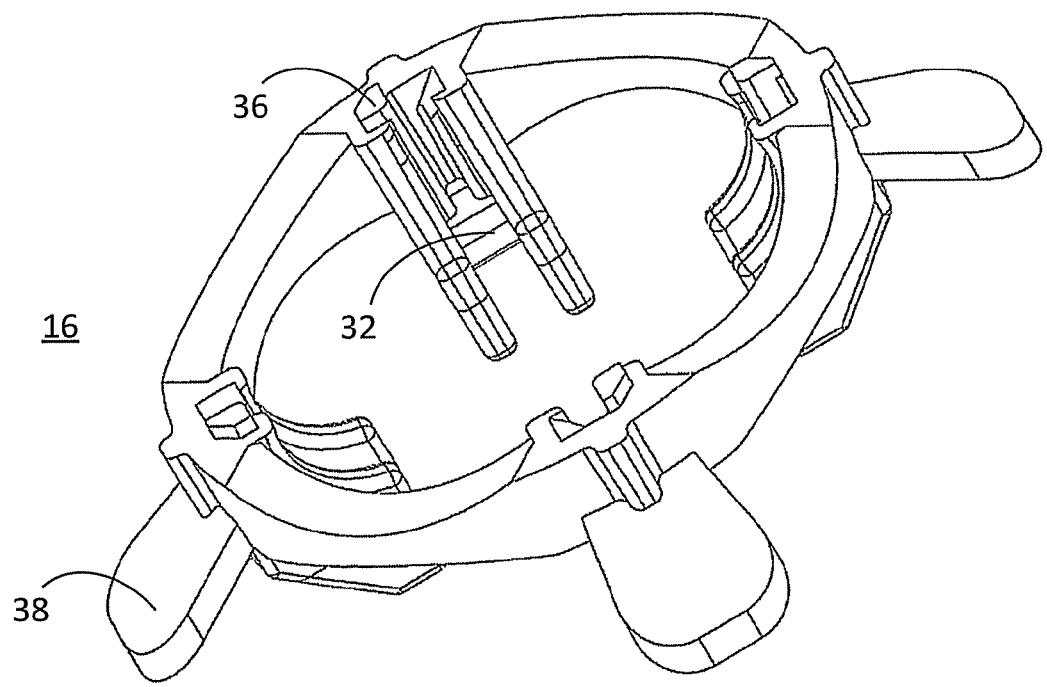
FIG. 4 is a perspective view of one example of a clip according to one example of the present invention.
Figure 5:
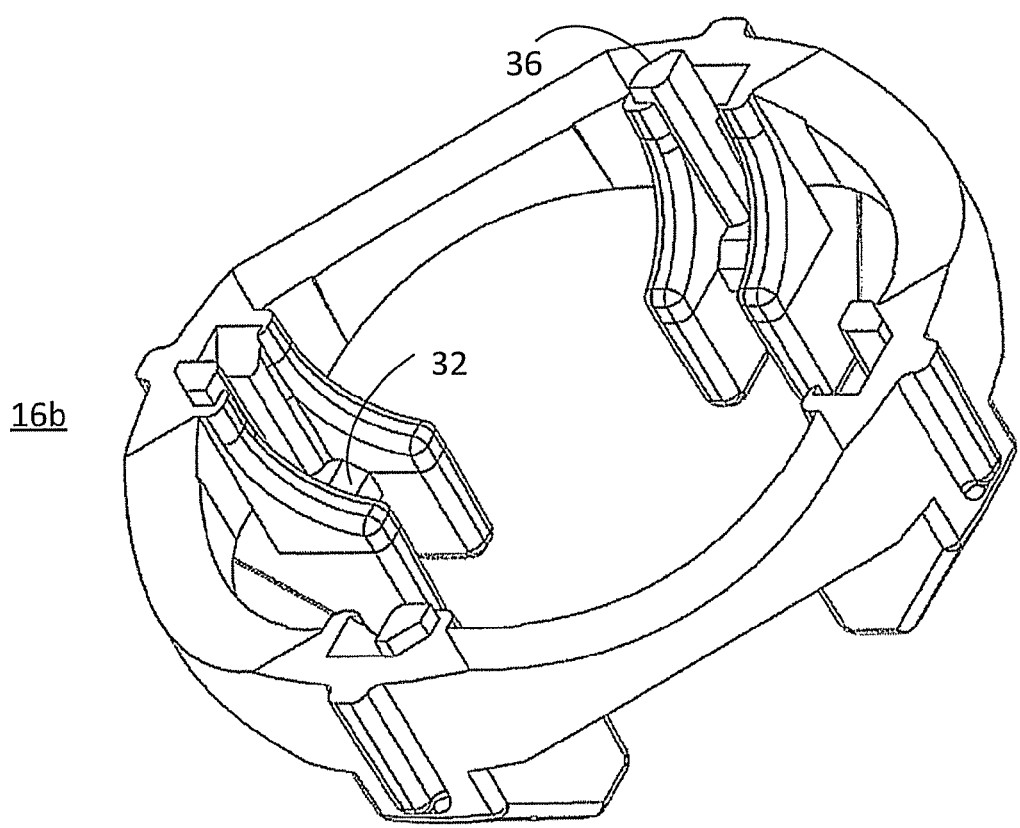
FIG. 5 is a perspective view of a second example of a clip according to one example of the present invention.

FIG. 4 illustrates an example of clip 16 in isolation from other components of the antenna assembly. FIG. 5 illustrates an alternative example, clip 16b. Clip 16b is similar to clip 16, but does not include tabs 38. Where elements are common to each example, the same reference numerals are used and description of such common elements is not repeated.

Figure 6:
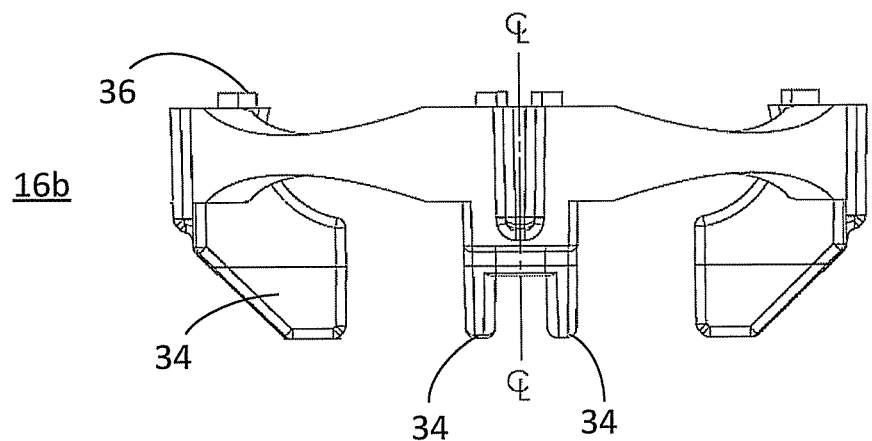
FIG. 6 is a side view of the second example of a clip.
Figure 7:
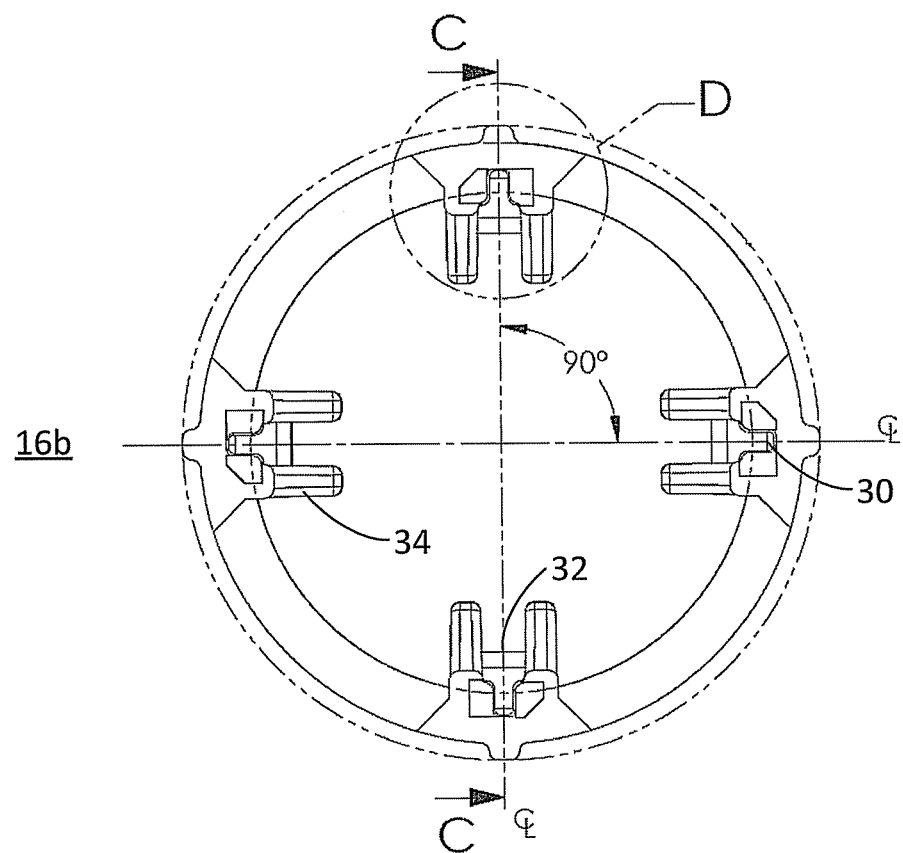
FIG. 7 is a top view of the second example of a clip.

FIGS. 6-9 illustrate various features with respect to the example of clip 16b as illustrated in FIG. 5. FIG. 6 is a side view of clip 16b. The gussets 34 are shown from the sides and from the end. Standoff 36 is also illustrated projecting above the clip 16b. This view illustrates that each pair of retainers is oriented approximately 90 degrees with respect to the other pair. FIG. 7 is a top view of clip 16b. A cut-away view as indicated by broken line C is provided in FIG. 8. A cut-away view of retainer 16b as indicated by broken C line circle D is provided in FIG. 9. Referring to FIG. 6, standoffs 36 are included to space the clip 16 from the feedboard PCB. This prevents the clip 16 from damaging printed circuits present on the feedboard PCB.

Figure 8:
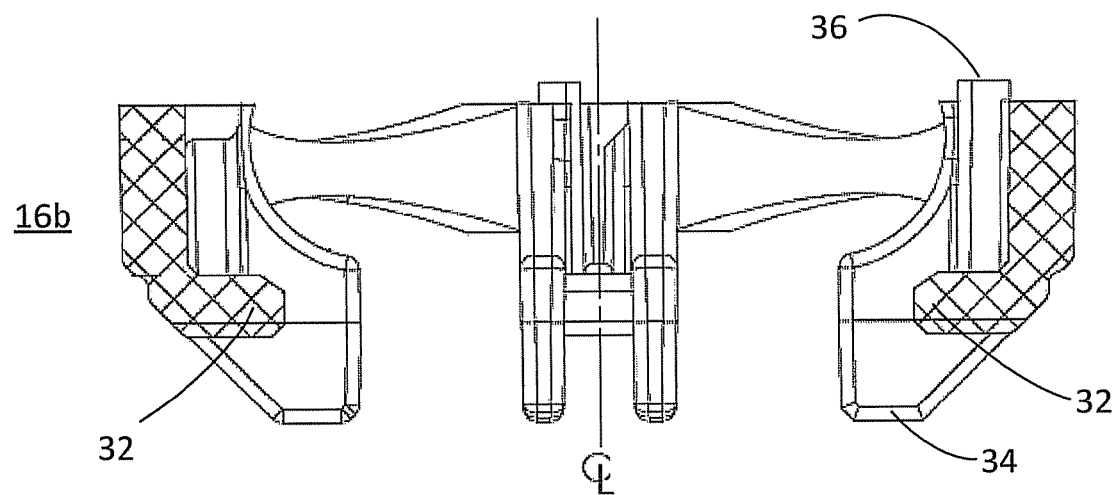
FIG. 8 is a cut-away side view of the second example of a clip.
Figure 9:
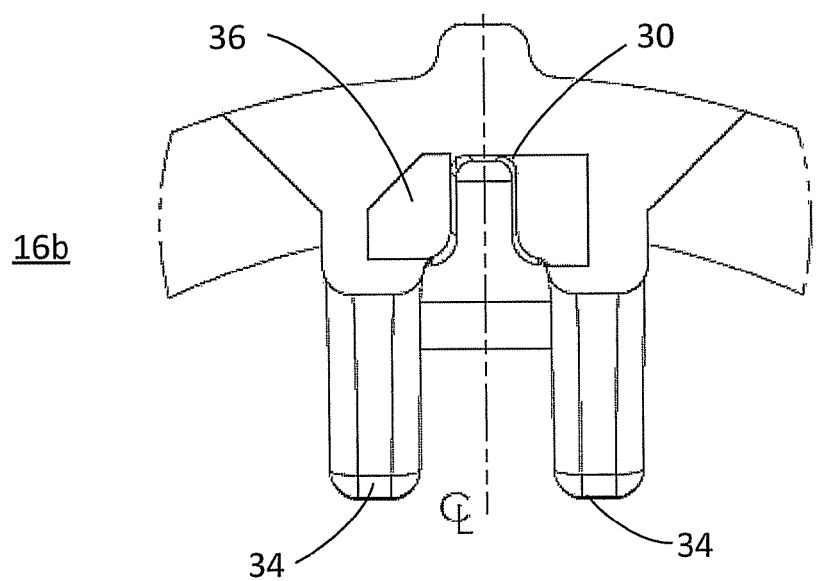
FIG. 9 is a detail view from the top of the second example of a clip.

Referring to FIG. 8, nubs 32 are shown in cross hatch, extending inward. The nubs 32 may be beveled to assist in assembly of the dipole PCBs into the clip, and to accommodate the shapes of the indentation on the dipole PCBs. Referring to FIG. 9, the slot 30 is illustrated in detail with respect to nub 32 and gussets 34.

Figure 10:
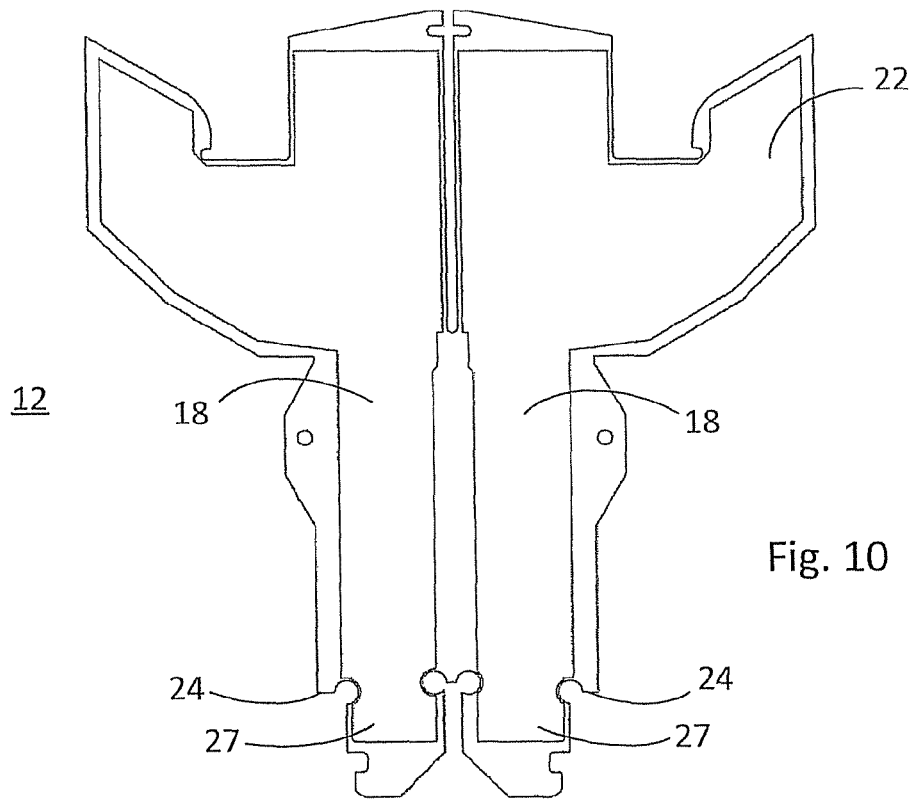
FIG. 10 is a view of a first surface of a dipole PCB according to one example of the present invention.
Figure 11:
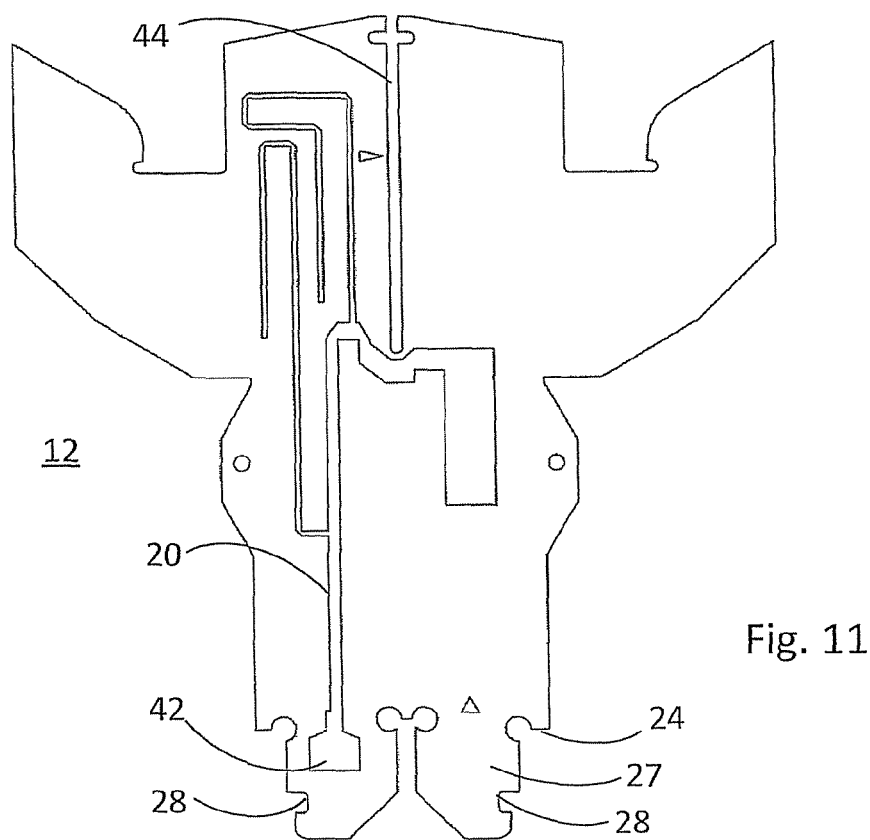
FIG. 11 is a view of a second surface of a dipole PCB according to one example of the present invention.

Referring to FIGS. 10 and 11, dipole PCB 12 represents one half of a cross polarized radiating element 10. FIG. 10 illustrates a first side of dipole PCB 12 and FIG. 11 illustrates a second side of dipole PCB 12. Conductive planes 18 are on the first side, and the feed line 20 is on the second side. The feed line 20 is capacitively coupled to both the conductive planes 18 which, when excited, combine to provide dipole 22. Slot 44 descends from the top of the dipole PCB 12.

Figure 12:
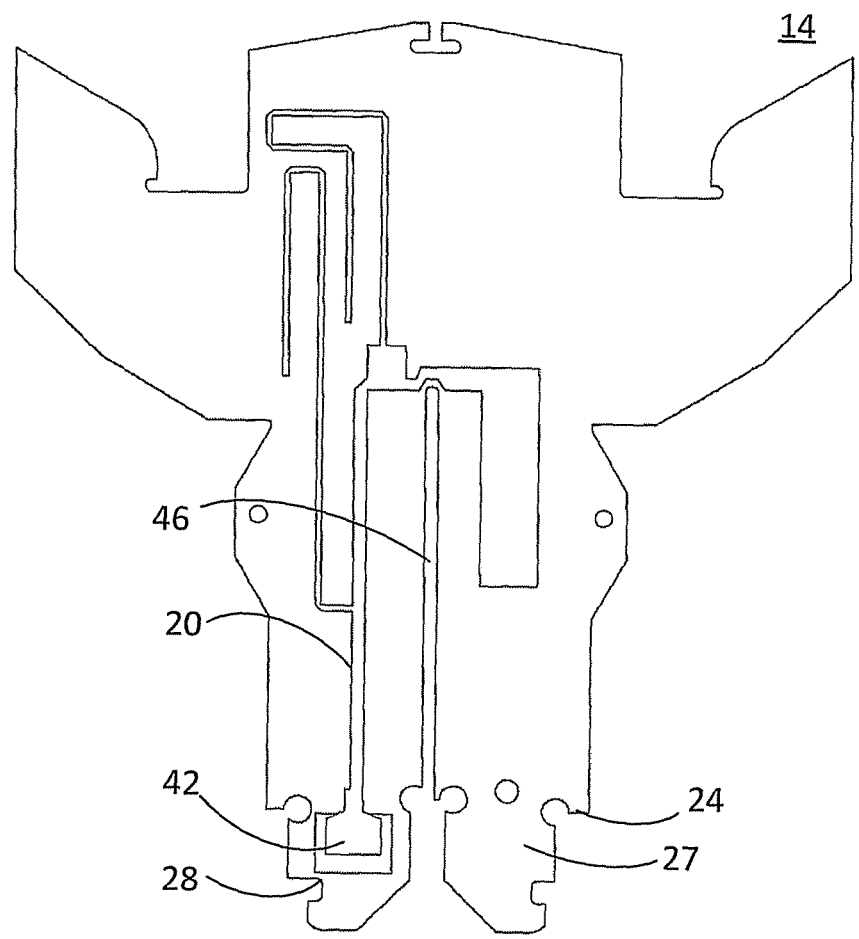
FIG. 12 is a view of a first surface of another example of a dipole PCB according to one example of the present invention.

Referring to FIG. 12, one side of dipole PCB 14 is illustrated. Dipole PCB 14 includes many of the features of dipole PCB 12, however, slot 46 extends upwardly from the bottom of dipole PCB 14. To assemble the cross polarized radiating element 10, the two dipole PCBs 12, 14 are coupled together such that slot 44 engages the top portion of dipole PCB 14, and slot 46 engages the bottom portion of dipole PCB 12. The dipole PCBs 12, 14 are preferably arranged such that they bisect each other, and are at approximately right angles to each other.

In an alternative embodiment (not illustrated), a dipole square may be set atop a pair of base PCBs. The base PCBs include the feed line 20, conductive plane 18, extensions 27, and indentations 28 as described above. Additionally, the extensions 27 pass through the aperture 25 of feedboard 26, and are engaged by a clip 16 as described above. However, instead of integrating a dipole element on the same PCB as the base PCB, a dipole square element is attached to the top of the base PCBs. See, for example, U.S. Pat. No. 7,688,271, the disclosure of which is incorporated by reference.

What is claimed is:

1. An antenna, comprising:
   a) a feedboard printed circuit board having a feed network;
   b) at least one radiating element, comprising:
      1) a first printed circuit board base disposed on a first surface of the feedboard printed circuit board supporting a first polarized radiator disposed above the first surface, the first base including a first feed line connected to the feed network, a first longitudinal slot along a center axis, a first extension extending through a first slot on the feedboard printed circuit board, and first and second indentations disposed on the first extension;
      2) a second printed circuit board base disposed on the first surface of the feedboard printed circuit board supporting a second polarized radiator disposed above the first surface, the second base including a second feed line connected to the feed network, a second longitudinal slot along a center axis, a second extension extending through a second slot on the feedboard printed circuit board, and third and fourth indentations disposed on the second extension, the first and second longitudinal slots being arranged such that the first and second bases bisect each other at approximately right angles; and
   c) at least one clip, the clip having first and second retainers engaging the first and second indentations of the first extension, and third and fourth retainers engaging the third and fourth indentations of the second extension; wherein each of the retainers of the clip further comprises:
      1) a slot, dimensioned to receive a printed circuit board of the thickness of the first and second extensions; and
      2) a nub, dimensioned to engage one of the indentations of the first and second extensions.

2. The antenna of claim 1, further comprising a plurality of radiating elements and a plurality of clips arranged in an array.

3. The antenna of claim 1, wherein each retainer further comprises at least one tab arranged such that applying pressure to the tab releases the nub from an indentation.

4. The antenna of claim 1, wherein each retainer further comprises at least one gusset.

5. The antenna of claim 1, wherein the radiating element is oriented on the feedboard printed circuit board such that the first polarized radiator produces a +45 degree polarization and the second polarized radiator produces a −45 degree polarization.

6. The antenna of claim 1, wherein the first and second polarized radiators comprise dipole radiators.

7. The antenna of claim 1, wherein the first polarized radiator comprises a first dipole radiator formed with the first base, and the second polarized radiator comprises a second dipole radiator formed with the second base.

8. The antenna of claim 1, wherein the first and second polarized radiators comprise a cross-polarized element supported by the first base and the second base and coupled to the first feed line and the second feed line.

* * * * *